United States Patent [19]

Yasumura

[11] 4,292,598

[45] Sep. 29, 1981

[54] AUTOMATIC GAIN CONTROL CIRCUIT

[75] Inventor: Hiroto Yasumura, Kumagaya, Japan

[73] Assignee: Tokyo Shibaura Denki Kabushiki Kaisha, Kawasaki, Japan

[21] Appl. No.: 42,345

[22] Filed: May 25, 1979

[30] Foreign Application Priority Data

Jun. 1, 1978 [JP] Japan .................................. 53-66077
Feb. 15, 1979 [JP] Japan .................................. 54-15453
Feb. 15, 1979 [JP] Japan .................................. 54-15454
Feb. 15, 1979 [JP] Japan .................................. 54-15455

[51] Int. Cl.³ ............................................. H03G 3/20
[52] U.S. Cl. .................................. 330/281; 330/141; 358/177
[58] Field of Search ............... 330/141, 281; 358/177; 455/244, 250

[56] References Cited

U.S. PATENT DOCUMENTS 3,624,290  11/1971  Hofmann ...................... 358/177 X

FOREIGN PATENT DOCUMENTS 566305  8/1977  U.S.S.R. ............................. 330/281

Primary Examiner—James B. Mullins

[57] ABSTRACT

An automatic gain control circuit includes a VCA, an AGC detector and an AGC time constant circuit which form an AGC loop. The AGC circuit further includes a level detector and a time constant designator. When the level detector detects an excess level of a signal derived from the VCA, the designator changes the time constant of the time constant circuit.

18 Claims, 16 Drawing Figures

AUTOMATIC GAIN CONTROL CIRCUIT

The present invention relates to an automatic gain control circuit which automatically controls the output signal to be settled within a desired level range against a randomly varying input signal.

An automatic gain control (AGC) circuit has been used in various types of analog circuits. One of the typical examples is a video intermediate frequency (IF) amplifier circuit. The AGC circuit of the amplifier controls the peak value of a synchronizing signal to be at a fixed level.

The video IF signal inputted into the video IF circuit varies in level due to various causes, for example, fading or fluttering and pulsate noise mixed with the television signal. As is well known, fading occurs when the television signal is reflected and/or diffracted in its traveling path so that the intensity of the electric field of the received signal, varies with time. Fluttering takes place when the antenna and/or the feeder shakes by wind or when an airplane passes above the antenna. These phenomena cause an antenna input signal to vary in level. In order to reliably respond to such level variations, the time constant of the AGC loop of the AGC circuit is selected as small as possible as long as the peak value of the horizontal synchronizing pulse can be held for one period (approximately 64 $\mu$s). The time constant is selected to be 1.2 ms, for example.

Included in the pulsate noise are ignition noise of automobiles, and rectifying noise emitted from the rectifier diode in an associated power source circuit. The pulse widths of this noise is very short, at most several $\mu$s to several ms, but the amplitude thereof is very high. Such noise pulses can be superposed on the horizontal synchronizing pulse. Since the time constant of the AGC loop is about 1.2 ms, as mentioned above, the AGC circuit responds to the pulse noise. It is undesirable, however, that the AGC circuit respond to such noise, or an excessive level in the video IF signal. If the AGC circuit responds to the pulse noise and decreases the circuit gain, the following undesirable effects occur. Let us consider a case, for example, where the gain is decreased in response to the pulsate noise and the pulsate noise disappears. When the period of the pulse noise is shorter than the time constant of the AGC circuit, immediately after the pulse noise disappears, the gain of the AGC circuit is still low. For this reason, the horizontal/vertical synchronizing pulse will have a lower level than normal. For this reason, during a period that the level of the synchronizing pulse is restored to its normal one, the horizontal/vertical synchronization fails.

The AGC loop must have such a time constant to stably hold the DC component for AGC control during the horizontal scanning period. When the AGC circuit responds to the pulse noise, the failure of horizontal/vertical synchronization and picture deterioration are liable to occur, because of the time constant. In other words, even if the pulsate noise has disappeared, there occurs a delay in the time taken for the AGC voltage to be restored to the normal AGC voltage. In this way, if the AGC voltage at the noise pulse arrival fails to be restored to the given voltage, failure of the synchronization takes place and picture quality is deteriorated. This will be described with reference to FIGS. 1A to 1C. FIG. 1A shows a state that pulsate noise n is mixed with a negative modulated video signal. The noise mixing indicates the arrival of an excessive level pulse. FIG. 1B shows an output voltage $V_{AGC}$ from the AGC time constant circuit which generally controls the gain of the video IF circuit with reference to the top level of the synchronizing signal (H) of a video signal. Accordingly, when the noise n of an excessive pulse is mixed into the video signal, the AGC voltage $V_{AGC}$ is lowered, as shown by the solid line in FIG. 1B, so as to decrease the gain. When the noise n disappears, the AGC voltage $V_{AGC}$ must be restored to a value approximate to the voltage before the noise is mixed. However, because of the presence of the AGC time constant circuit in the AGC loop, the AGC voltage cannot be immediately restored to its fixed value. That is to say, it is not restored until the lapse of time corresponding to the time constant of the AGC time constant circuit. As a result, the AGC operation decreases the level of the noise n and further decreases unnecessarily the gain of the video IF circuit during the time constant period of the AGC time constant circuit. For this, even after the noise n disappears, the level of the video signal is controlled so as to be decreased during the time constant period so that the level of the synchronizing signal falls. This causes failure of the synchronization and degradation of the picture quality.

As described above, in order to avoid failure of synchronization, it is necessary that the AGC circuit does not respond to the pulse noise. It is preferable that the time constant of the AGC loop is large, relative to the pulse noise duration. Preferable is 0.3 sec to 0.4 sec, for example. However, this requirement is contrary to that for the fading and fluttering phenomena. If the time constant within the AGC loop is set to be large in order to avoid failure of synchronization, the AGC circuit can not follow rapid level changes of those due to the fading and fluttering phenomena. Conversely, if the time constant of the AGC loop is set to be small in order to improve the response to the fading and fluttering phenomena, failure of synchronization and degradation of the picture quality due to a high level pulse noise is liable to occur.

A conventional approach to the problem mentioned above employs a small time constant of the AGC loop and a noise eliminator circuit or a noise peak clipper in the AGC circuit. The use of the noise eliminator, however, involves new problems. When no input signal is applied to the circuit, that is to say, the circuit is in the maximum sensitivity state, if a video IF signal with a high amplitude is inputted, the eliminator circuit clips not only the peak of the synchronizing signal but also the high level portion of the video signal. As a result, the gain of the AGC circuit is controlled by the clipped peak of the video signal in addition to the peak of the synchronizing signal. In this case, the level of the AGC control signal is insufficient to decrease the gain of the AGC circuit so that the AGC circuit is stabilized in a state that it is clipped by the video input signal with a high amplitude. This phenomenon is called a lock-out or a lock-up phenomenon which greatly distorts the video signal wave form. Additionally, when the antenna input signal quickly rises, there is a possibility that the eliminator circuit erroneously eliminates the synchronizing signal level, leading to the failure of the synchronization.

Accordingly, an object of the present invention is to provide an AGC circuit which may respond well to a level variation of an input signal, being free from the lock-out phenomenon and not influenced by the pulsate noise.

To achieve the above object, an AGC circuit according to the invention is provided with means to change the normal time constant of the AGC loop in accordance with the amplitude of incoming pulsate noise. When receiving an input signal with a normal amplitude, the AGC circuit selects the time constant for normal AGC operation, and the response speed of the AGC operation is the normal speed. When the received signal has an amplitude exceeding a given value for a short time, for example, when the pulsate noise with such an amplitude is received, comes the AGC circuit selects a longer time constant than the time constant for normal AGC operation. Therefore, the output signal, for example, a video detected signal, outputted from the AGC circuit is not influenced by the pulse noise.

The other objects, features and advantages of the invention will well be understood with reference to the following detailed description in conjunction with the accompanying drawings, in which.

Throughout the drawings, like reference numerals designate corresponding parts for simplicity of explanation.

Figure 1A:
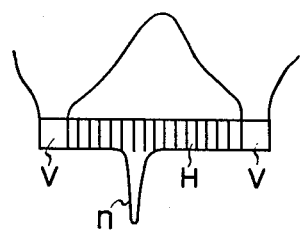
FIG. 1A shows a wave form illustrating when a pulse noise n is mixed with a negative video signal.
Figure 1B:
FIG. 1B shows a wave form of an AGC voltage $V_{AGC}$ wave form which is deformed by the pulse noise shown in FIG. 1A in which the solid line indicates a deformed $V_{AGC}$ and the broken line indicates an improved $V_{AGC}$.
Figure 1C:
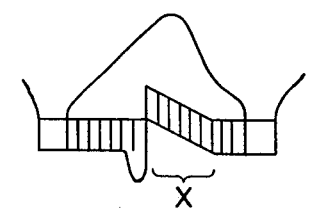
FIG. 1C shows a wave form illustrating a state that the AGC voltage with the deform shown in FIG. 1B decreases the level of a synchronizing signal at the portion X.
Figure 1D:
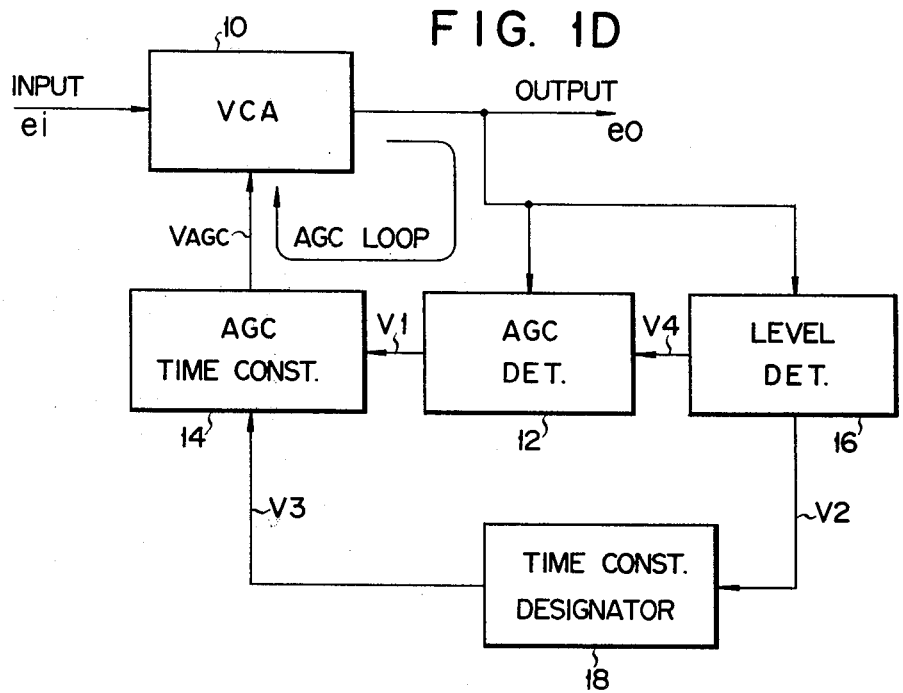
FIG. 1D shows a block diagram of a basic construction of an AGC circuit according to the invention.

Reference is first made to FIG. 1D illustrating a basic construction of an AGC circuit according to the invention. An input signal $e_i$ of which the amplitude level randomly varies is applied to a voltage controlled amplifier (VCA) of which the gain ($e_o/e_i$) is controlled by the DC level of an AGC control signal $V_{AGC}$ in order that the output signal $e_o$ of the amplifier is set at at a given level. The output signal $e_o$ is applied to an AGC detector 12 where it is converted into a first signal V1 with a DC component corresponding to the level or amplitude of the signal $e_o$. The first signal V1 includes a ripple component corresponding to the period of the signal $e_o$ and therefore it cannot directly be used as the control signal $V_{AGC}$ to control the gain of the VCA 10. For this, the first signal is once applied to an AGC time constant circuit 14 which is a reactive energy storing circuit normally of CR type. The ripple component of the first signal V1 is substantially removed by the time constant circuit 14 and the first signal V1 is converted into the control signal $V_{AGC}$ which is a DC signal proportional to the peak value or the average value of the first signal V1.

Those components 10, 12 and 14 cooperate to form an ordinary AGC circuit including a closed AGC loop. The circuit shown in FIG. 1D further includes the following components essential to the invention. The output signal $e_o$ is applied to a level detector 16 in order to detect incoming pulse noise or the pulse noise level. The level detector 16, when the peak value of the output signal $e_o$ exceeds a given value, produces a second signal V2. The second signal V2 is used to control a time constant designator for controlling the time constant of the AGC time constant circuit 14. When the input signal $e_i$ is a television video IF signal, the given value of the detector 16 is determined by a given level set up with relation to the peak level of the horizontal synchronizing pulse, for example. The second signal V2 is applied to the time constant designator 18 which in turn produces a third signal V3. The third signal V3 is used to change the amplitude of charge/discharge current to and from the time constant circuit 14 or time constant of the same. In other words, the transfer function ($V_{AGC}$/V1) of the time constant circuit 14 is changed by the third signal V3.

In operation, when the peak value of the signal $e_o$ is below the given level of the detector 16, no second signal V2 is produced so that an ordinary AGC operation is performed. In this case, the time constant of the time constant circuit 14 is so selected as to speed up the response of the AGC operation. That time constant is the intrinsic one of the AGC time constant circuit 14. While this intrinsic time constant is in effect, the components 10 to 14 executes a normal AGC operation. More specifically, when the top level of the synchronizing signal included in the signal $e_o$ does not reach the given level, as indicated by a wave form a in FIG. 1E, the gain of the VCA 10 increases and the AGC operation is effected so that the top level of the synchronizing signal approaches to the given level E3 in accordance with the intrinsic time constant. When the top level of the synchronizing signal of the signal $e_o$ exceeds the given level E3, as indicated by a wave form b in the same figure, the gain of the VCA 10 decreases so that the AGC control is effected in order that the top level of the synchronizing signal swiftly approaches to the given level E3. In this way, the top level of the synchronizing signal approaches to the given level E3 in accordance with the intrinsic time constant permitting a rapid response of the AGC operation. Through the normal AGC operation, the AGC circuit shown in FIG. 1D may well respond to the fluttering and fading.

Figure 1E:
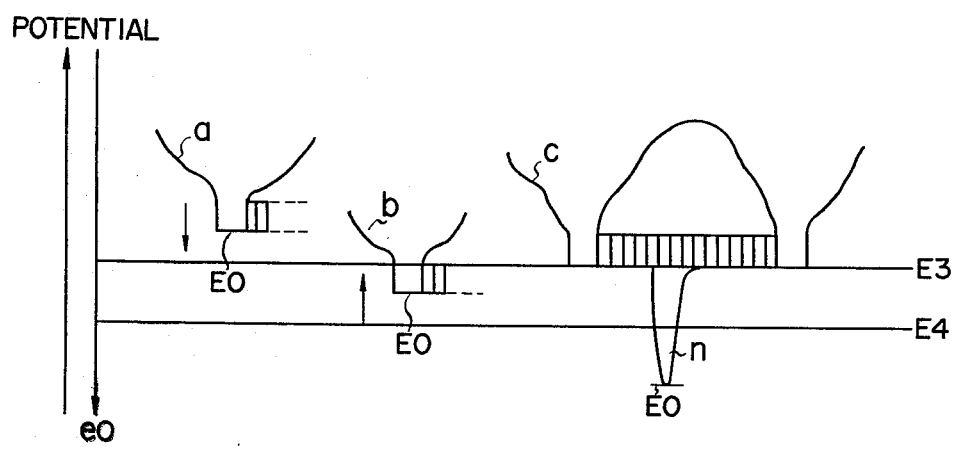
FIG. 1E shows a level diagram illustrating a given level E3 in an AGC detector 12 used in the AGC circuit shown in FIG. 1D for a normal operation of AGC and a given level E4 in a level detector 16 for AGC time constant control.

As indicated by a wave form c in FIG. 1E, when a pulse noise n with a high peak is superposed on the signal $e_o$, the signal $e_{on}$ containing the noise n is applied to the level detector 16. When the peak level of the noise n exceeds the given level of the detector 16, the second signal V2 is produced. Upon receipt of the second signal V2, the designator 18 provides the third signal V3 to the time constant circuit 14, in order to increase the time constant of the AGC. Upon the application of the third signal V3, the time constant of the time constant circuit 14 substantially increase, compared to the intrinsic time constant at the time of normal AGC operation. In other words, the time constant circuit 14 little responds to the first signal V1 going to rapidly change, like the noise pulse n in FIG. 1E. And the control signal $V_{AGC}$ is little deformed unlike the case in the FIG. 1B, and the level of $V_{AGC}$ immediately before the pulse noise n is held. When the pulse noise n disappears, the time constant of the time constant circuit 14 immediately returns to that in the normal operation so that the AGC circuit returns to the original state. As described above, the AGC circuit shown in FIG. 1D can perform the AGC operation with a good response to the signal $e_o$ below the given level E4 of the detector 16. Therefore, the AGC operation is disturbed by no means by the pulse noise n above the given level E4. That is to say, there is no possibility that the sag as shown in FIG. 1B disturbs the signal as shown in FIG. 1C. Additionally, the AGC circuit provides the output signal $e_o$ and the control signal $V_{AGC}$ properly corresponding to the input signal $e_i$ including no pulse noise with a level exceeding the given level. Accordingly, the normal AGC operation is performed in accordance with the level of output signal $e_o$ at that time so that the lock-out or the lock-up never occurs.

In the AGC circuit mentioned above, the AGC loop gain may be changed upon the generation of the second signal V2. That is to say, when the second signal V2 is produced, the detector 16 provides a fourth signal V4 to the detector 12. When the fourth signal V4 is inputted, the transfer function of the detector 12 decreases or is zeroed. In this case, when the pulse noise signal occurs, the first signal V1 is decreased or disappears. At this time, the time constant of the time constant circuit 14 holds the DC level of the control signal $V_{AGC}$ at nearly constant level so that the pulse noise n little changes the gain of the AGC circuit.

Figure 2:
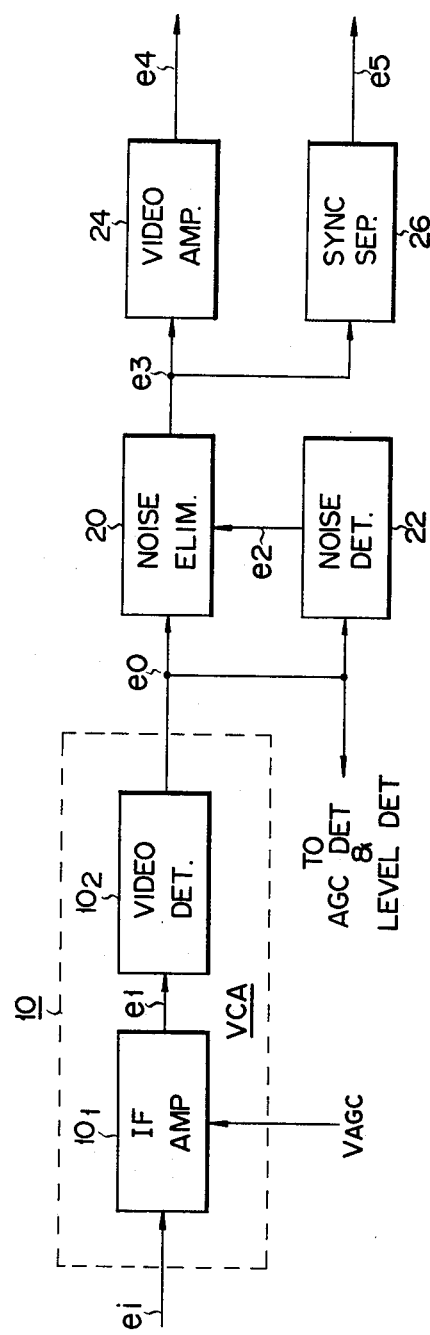
FIG. 2 shows a block diagram of an example circuit in which the AGC circuit shown in FIG. 1D is applied to a video intermediate frequency amplifier stage of a television.

Turning now to FIG. 2, there is shown a circuit construction when the AGC circuit shown in FIG. 1D is applied to the video IF amplifier circuit of a television set. A video IF signal $e_i$ is applied to an IF amplifier $10_1$ of variable gain type where it is amplified and then is inputted as an IF output signal $e_1$ to the video detector $10_2$. The IF output signal $e_1$ is detected by the detector $10_2$ and is outputted as a video output signal $e_o$ which in turn is applied to the detectors 12 and 16 shown in FIG. 1D. As a result, the control signal $V_{AGC}$ corresponding to the signal $e_o$ is supplied to the IF amplifier $10_1$ from the time constant circuit 14. The signal $e_o$ is also inputted into a noise eliminator 20 and a noise detector 22. The noise component detected by the detector 22 is phase-inverted to be supplied as a noise cancelling signal $e_2$ to the eliminator. The noise eliminator 20 sums the signal $e_o$ and the signal $e_2$ to cancel only the noise component. In place of the noise elimination by the subtractive summation, the noise may be eliminated by clipping the noise pulse exceeding a given amplitude. The video signal $e_3$ of which the noise is eliminated by the eliminator 20, is applied to a video amplifier 24 and a synchronizing separation circuit 26. Then, the amplifier 24 produces a video signal $e_4$ and the synchronizing separation circuit 26 a horizontal/vertical synchronizing signal $e_5$.

Figure 3:
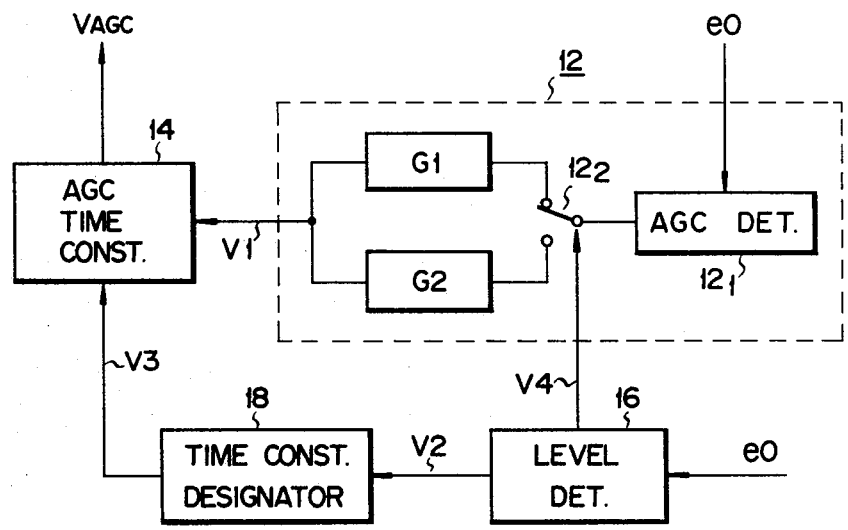
FIG. 3 shows a block diagram of an example of the AGC detector 12 shown in FIG. 1D.

Turning now to FIG. 3, there is shown a circuit construction of the AGC detector 12 in the AGC circuit shown in FIG. 1D. In FIG. 3, the transfer functions G1 and G2 in the AGC loop as well as the time constant of the time constant circuit 14 are changed mainly aiming at restricting the occurrence of the deformation as shown in FIG. 1B by lowering the loop gain of the AGC at the arrival of the pulse noise n or an excessive amplitude input signal as shown in FIG. 1A. In the normal AGC operation, a switch $12_2$ selects the first transfer function G1. In this case, the time constant of the time constant circuit 14 is small for coping with the fluttering or the fading while the transfer function of the AGC loop is large. When the pulse noise with a level larger than the given level E4 causes the detector 16 to produce the second signal V2, the designator 18 and the detector 16 produce the third and fourth signals V3 and V4, respectively. Then, the third signal V3 increases the time constant of the time constant circuit 14 and the fourth signal V4 switches the switch $12_2$ to select the second transfer function G2. When the first and second transfer functions G1 and G2 are $|G1|>|G2|$, the transfer function of the AGC loop is extremely made small by the selection of G2. So long as the second signal V2 occurs, the normal AGC function is restricted while the time constant of the time constant circuit 14 is large. The result is that the AGC voltage $V_{AGC}$ has no deformation.

Figure 4:
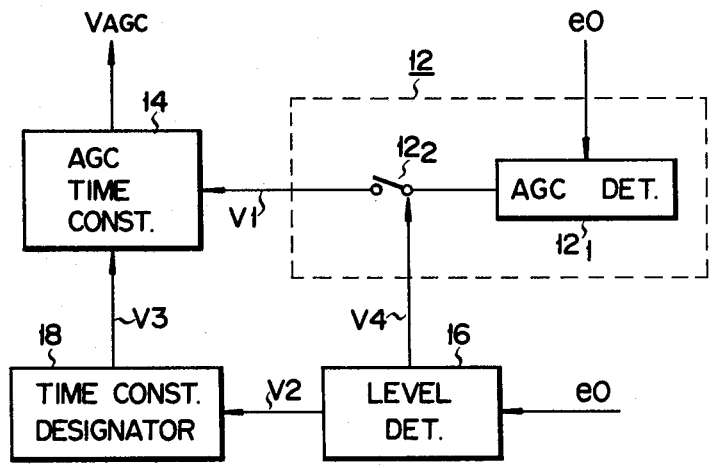
FIG. 4 shows a block diagram of a modification of the AGC detector 12 shown in FIG. 3.

A modification of the AGC detector 12 shown in FIG. 3 is illustrated in FIG. 4. In FIG. 3, the transfer function G1 or G2 is inserted in the AGC loop and is alternatively selected by the switch $12_2$. In FIG. 4, the AGC loop is closed and opened by the switch $12_2$. This corresponds to a situation in the FIG. 3 case that G1=1 and G2=0, or example, (G1 is not necessarily 1). In the FIG. 4 construction, when the signal with a level exceeding the given level of the level detector 16 the AGC loop is completely shut off. The shutting off the loop substantially increases the time constant of the time constant circuit 14. In this case, if the time constant of the time constant circuit 14 is further increased by the third signal V3, the deformation as shown in FIG. 1B is effectively decreased.

Figure 1F:
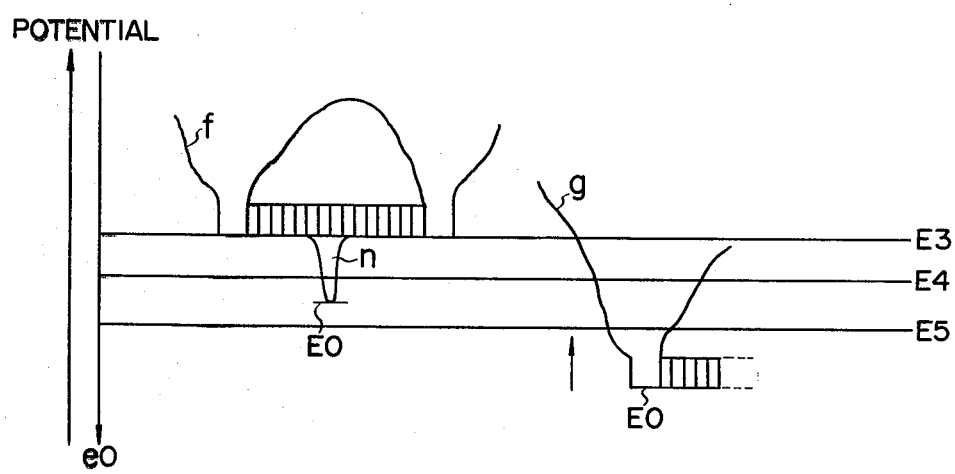
FIG. 1F shows a level diagram illustrating a second given level E5 in the level detector 16 in addition to the levels E3 and E4.
Figure 5:
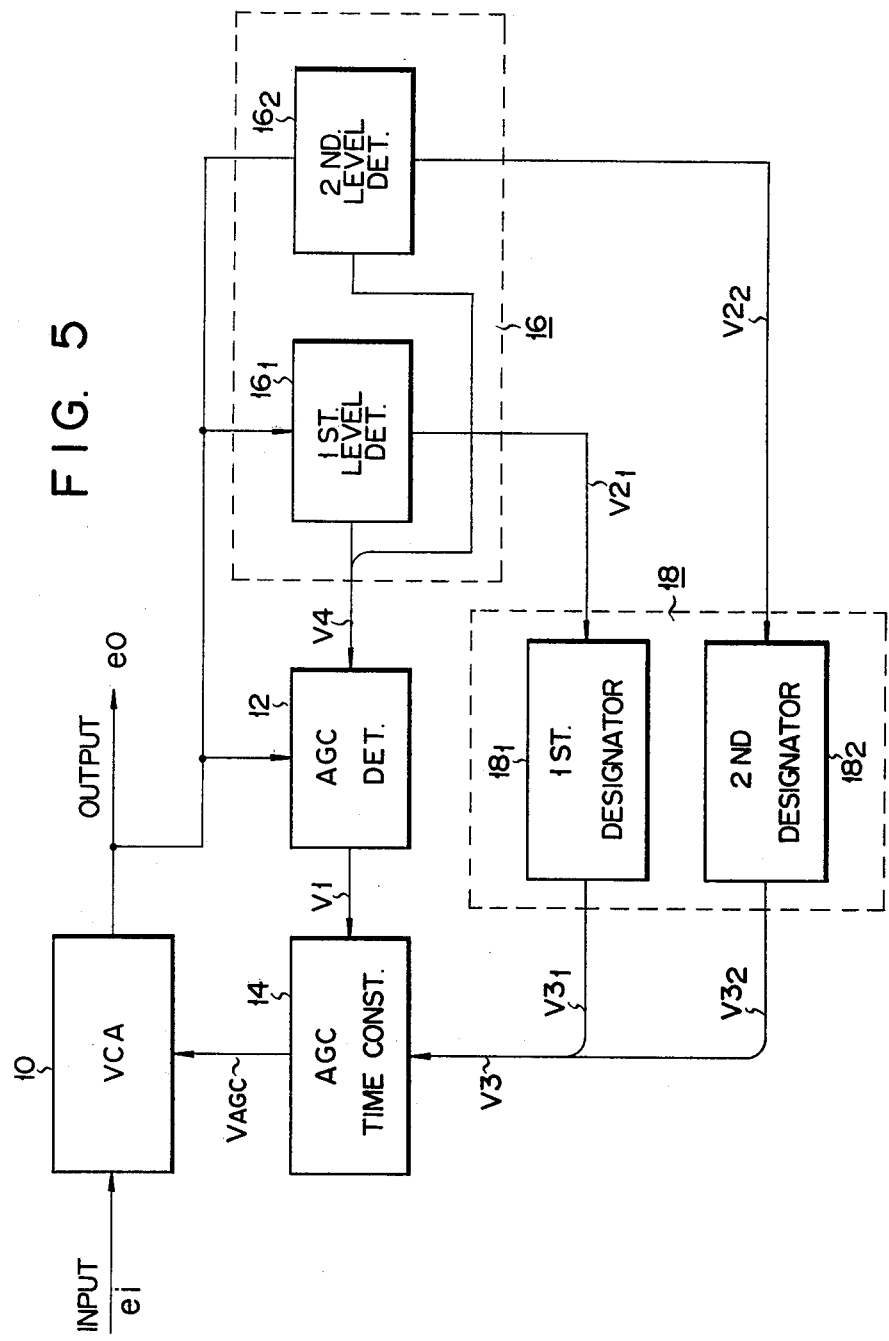
FIG. 5 shows a block diagram of a modification of the AGC circuit shown in FIG. 1D.

A modification of the AGC circuit shown in FIG. 1D is illustrated in FIG. 5. The level detector 16 and the time constant designator 18 may be increased in number. This example employs two systems of the detector 16 and the designator 18. The output signal $e_o$ is inputted to a first level detector $16_1$. As shown in FIG. 1F, when the peak level of the signal $e_o$ exceeds the first given level E4, the detector $16_1$ supplies the second signal $V2_1$ to the first designator $18_1$. Upon the receipt of the second signal $V2_1$, the designator $18_1$ supplies the third signal $V3_1$ to the AGC time constant circuit 14. Similarly, the output signal $e_o$ is inputted to the second level detector $16_2$. As indicated by a wave form g in FIG. 1F, when the signal $e_0$ peak level exceeds a second given level E5, the detector $16_2$ supplies the second signal $V2_2$ to the second designator $18_2$. The second signal $V2_2$ causes the designator $18_2$ to produce a third signal $V3_2$ for transfer to the time constant circuit 14.

In the circuit shown in FIG. 5, the two systems of detector 16 and designator 18 may be used in the following manner. The first system having the detector $16_1$ and the designator $18_1$ is used as in the manner shown in FIG. 1D. When a pulse noise n occurs of which the level is higher than the first given level E4 but lower than the second given level E5, the time constant of the time constant circuit 14 is increased and the AGC circuit does not respond to the pulse noise. When an excessively large pulse takes place exceeding the second given level E5, if the AGC circuit does not respond to the large pulse, a long time is taken until the operation of the AGC circuit settles down. Such a large pulse takes place when an input signal is applied after the AGC circuit has the maximum gain at the time of the channel switching, for example. Accordingly, when such an excessive signal occurs, it is advisable from a stability view point that the time constant of the time constant circuit 14 is positively decreased to hasten the response of the AGC circuit. As a result, the AGC circuit quickly responds to the excessive signal to provide a stable picture within a short period. The use of the second system including the detector $16_2$ and the designator $18_2$ further ensures the prevention of the lock-out phenomenon.

In the above-mentioned example, the time constant is increased by the first system of $16_1$ and $18_1$ while it is decreased by the second system of $16_2$ and $18_2$. When the AGC circuit according to the invention is applied to another circuit except the video intermediate frequency amplifier, the time constant may be increased by the first system and is further increased by the second system. Additionally, in the circuit of FIG. 5, the transfer function of the AGC loop as mentioned, referring to FIGS. 3 and 4, may be controlled by the fourth signal V4 derived from the first and/or second detector.

Figure 6:
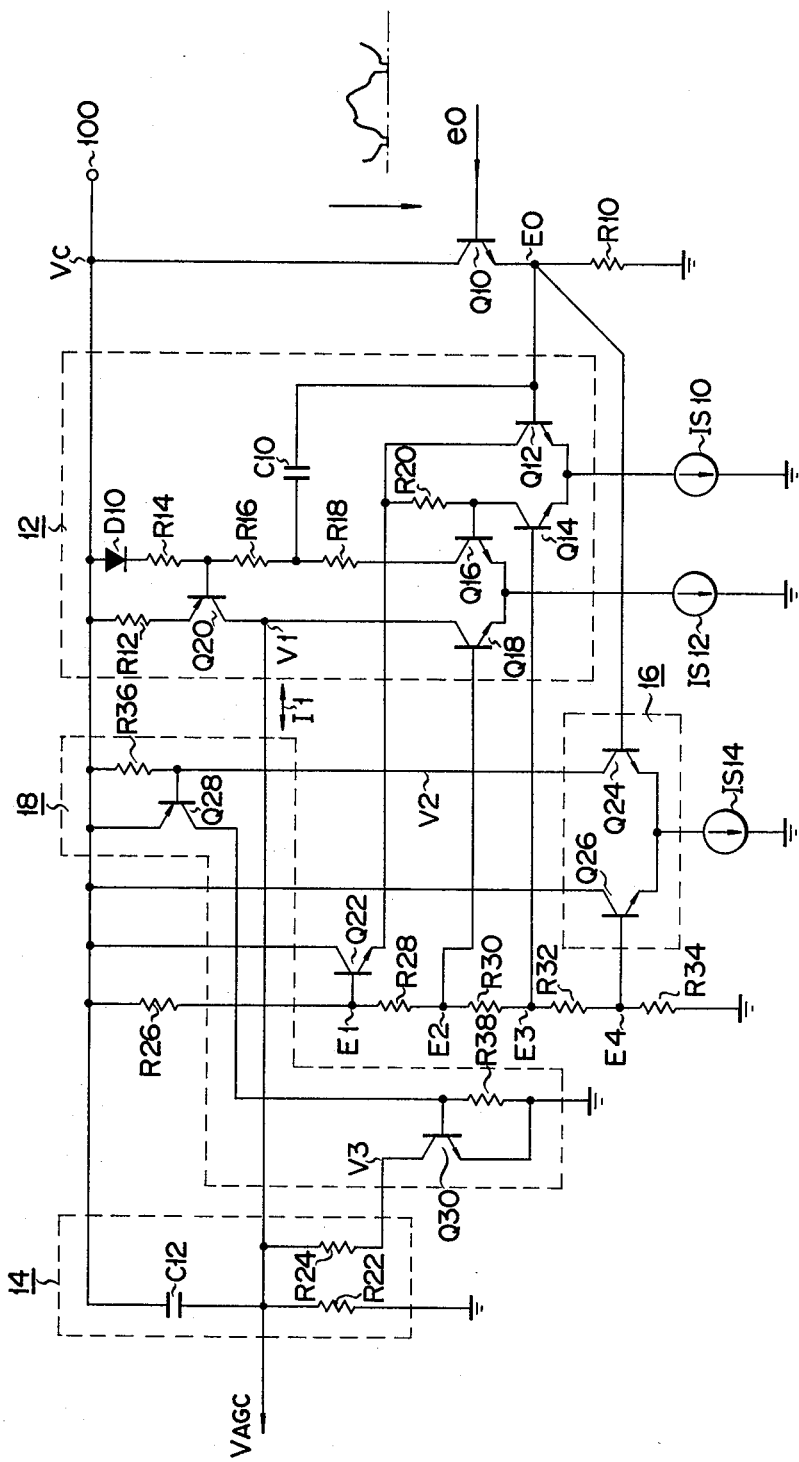
FIG. 6 shows a circuit diagram of an example of the AGC circuit shown in FIG. 1D.

FIG. 6 illustrates in more detail the components 12 to 18 in the AGC circuit shown in FIG. 1D. This example is the case that the AGC loop is not open. The output signal $e_o$ is inputted to the base of the NPN transistor Q10. It is assumed that the signal $e_o$ is a negatively modulated video signal. Accordingly, as the amplitude of the signal $e_o$ increases, the base potential of the transistor Q10 drops. The transistor Q10 is connected at the collector to a power source 100 with a potential Vc and at the emitter to ground via a resistor R10. The emitter of the transistor Q10 also is connected to the base of the NPN transistor Q12. The emitter of the transistor Q12, together with the emitter of a transistor Q14 of NPN type, is grounded through a current source IS10.

The transistor Q14 is connected at the collector to the base of an NPN transistor Q16. The emitter of the transistor Q16, together with the emitter of an NPN transistor Q18, is connected to ground through the current source IS 12. The collector of the transistor Q18 is connected to the collector of a PNP transistor Q20. The emitter of the transistor Q20 is connected through the resistor R12 to the power source 100. The power source 100 is connected to the base of the transistor Q20, through the anode to cathode path of a diode D10 and a resistor R14. The base of the transistor Q20 is connected to the collector of the transistor Q16, via resistors R16 and R18. The collector of the transistor Q14 is connected through a resistor R20 to the collector of the transistor Q12 and the collector of the transistor Q12 is connected to the emitter of an NPN transistor Q22.

The node between the resistors R16 and R18 is connected through a capacitor C10 to the base of the transistor Q12. Since the base of the transistor Q12 and the collector of the transistor Q16 are inversely phased with each other, the negative feedback by the capacitor C10 forms a Miller integrator. The integrator is used to filter out high frequency components unnecessary or harmful for the AGC control from the signal $e_o$. The example employs the capacitor C10 in order that the AGC circuit does not respond to the inter-carrier of 4.5 MHz. The transistors Q12 to Q20 and the associated circuit parts cooperate to form the AGC detector 12.

The operation of the detector 12 follows. When the amplitude growth of the signal $e_o$ causes the base potential E0 of the transistor Q12 to drop, the collector current of the transistor Q12 is decreased. The current source IS10 feeds a constant current to the transistors Q12 and Q14. As a result, the collector current of the transistor Q12 decreases while the collector current of the transistor Q14 increases so that the collector potential of the transistor Q14 drops. Then, the base potential of the transistor Q16 drops and the collector current of the transistor Q16 decreases. The transistors Q16 and Q18 are supplied with a constant current from the current source IS12. The current feeding decreases the collector current of the transistor Q16 while increases the collector current of the transistor Q18. The transistor Q20, the diode D10, and the resistors R12 and R14 connecting to the transistors Q16 and Q18 cooperate to form a current mirror circuit. In other words, when the collector current of the transistor Q16 is decreased, the collector current of the transistor Q20 is correspondingly decreased.

Through the operation mentioned above, the amplitude increase of the signal $e_o$ or the drop of the potential E0 increases the collector current of the transistor Q18 while it decreases the collector current of the transistor Q20. Conversely, the amplitude decrease of the signal $e_o$ or the rise of the potential E0 decreases the collector current of the transistor Q18 while it increases the collector current of the transistor Q20. The difference between the collector currents of the transistors Q18 and Q20 becomes the current I1 corresponding to the first signal V1.

The collector of the transistor Q18 is connected through the capacitor C12 of the power source 100 and through a resistor R22 to ground. The capacitor C12, the resistor R22 and a resistor R24 to be given later cooperate to form the AGC time constant circuit 14 and the control signal $V_{AGC}$ is derived from the connection point of the capacitor C12 and the resistor R22. To the emitter of the transistor Q10 is connected the base of a transistor Q24. The emitter of the transistor Q24, together with the emitter of an NPN transistor Q26, is connected through a current source IS14 to ground. The collector of the transistor Q26 is connected to the power source 100 and the collector of the transistor Q24 is connected to the base of a PNP transistor Q28. The transistors Q24 and Q26 form the level detector 16 and the second signal V2 is derived from the collector of the transistor Q24.

Given to the base of the transistor Q26 is a given potential E4 for determining the given value of the detector 16. The potential E4 is supplied from a voltage divide circuit including resistors 26 to 34. That is, the base of the transistor Q26 is connected to the connection point between the resistors R34 and R32. The potential E3 at the connection point between the resistors R32 and R30 is applied to the base of the transistor Q14. The connection point potential E2 between the resistors R30 and R28 is applied to the base of the transistor Q18. The connection point potential E1 between the resistors R28 and R26 is applied to the base of the transistor Q22 and the collector of the transistor Q22 is coupled with the power source 100. The potential E1 provides the collector potential of the transistor Q12 and the potential E3 and the base bias of the transistor Q14. The potential E2 provides the base bias of the transistor Q18.

The transistor Q28 is connected at the emitter to the power source 100 and the base is connected through a resistor R36 to the power source 100. The collector of the transistor Q28 is grounded by way of a resistor R38. The connection point between the collector of the transistor Q28 and the resistor R38 is grounded through the base to emitter path of an NPN transistor Q30. The collector of the transistor Q30 is connected through the resistor R24 to the connection point between the capacitor C12 and the resistor R22. The transistors Q28 and Q30 and the resistors R36 and R38 form the designator 18.

The operation of the AGC circuit shown in FIG. 6 will be given. Assume first that the amplitude of the signal $e_o$ negative-modulated is lower than a level corresponding to the given level E4 of the detector 16. The emitter potential E0 of the transistor Q10 provided by the peak level (the top level of the synchronizing pulse) of the signal $e_o$ is higher than the given level E4, as indicated by the wave forms a and b in FIG. 1E, i.e. E0>E4. In this case, the transistors Q24, Q28 and Q30 have been turned on. That is, the resistor R24 is coupled in parallel with the resistor R22. The time constant at this time is approximately 1.2 ms, for example. The detector 12 forms a positive phase linear amplifier of a high output impedance. As indicated by the wave form a, when the amplitude decrease of the signal $e_o$ has increased the potential E0, the collector currents of the transistors Q12, Q16 and Q20 increase. The current I1 corresponding to the rise of the potential E0 is supplied to the connection point between the capacitor C12 and the resistor R22 in the time constant circuit 14, with the result that the DC level of the control signal $V_{AGC}$ increases. When the DC level of the signal $V_{AGC}$ rises, the gain of the VCA 10 (not shown in FIG. 6) increases. Upon the increase of the signal $e_o$ amplitude, the potential E0 decreases. Conversely, when the amplitude of the signal $e_o$ grows excessively (E3>E0>E4) in the range permitting the normal AGC operation, as shown by the wave form b in FIG. 1E, the reverse operation is performed, and the amplitude of the signal $e_o$ is reduced.

The above-mentioned feedback operation provides the convention or normal AGC operation so as to keep the amplitude of the signal $e_o$ constant.

Let us consider now a case where a high level pulse noise n is superposed on the signal $e_o$ and the signal E0 level becomes smaller than the signal E4 level, as shown by the signal wave form c in FIG. 1E. In this case, the transistors Q24, Q28 and Q30 are turned off. Turning off the transistor Q30 separates the end of the resistor R24 from the ground circuit, and the time constant of the time constant circuit 14 is increased. The time constant at this time is approximately 300 ms to 400 ms, for example. When the amplitude of the signal $e_o$ exceeds the given value (E0<E4), the time constant of the time constant circuit 14 is increased the one about 300 times as large as the intrinsic time constant. When the time constant grows to such a great amount, a small amount of variation of the current I1 little influences the DC level of the signal $V_{AGC}$. Accordingly, the AGC circuit is almost insensitive to the pulse noise to sustain the state before the pulse noise is mixed therewith. Therefore, no deformation as shown in FIG. 1B is produced.

When the pulse noise included in the signal $e_o$ disappears and E0>E4 is recovered, the AGC circuit immediately returns to the normal AGC operation. That is to say, the time constant of the circuit 14 is again returned to about 1.2 ms. Note here that the time constant is not determined by only the capacitor C12 and the resistor R22 (or R22//R24) but the amplitude of the current I1 for charging/discharging the time constant circuit 14 is also taken into consideration. That is, even if C12×R22 is constant, the charging/discharging current change depends on the amplitude of the current I1. Accordingly, when the current variation of I1 is small, the time constant of the AGC circuit 14 apparently grows.

Figure 7:
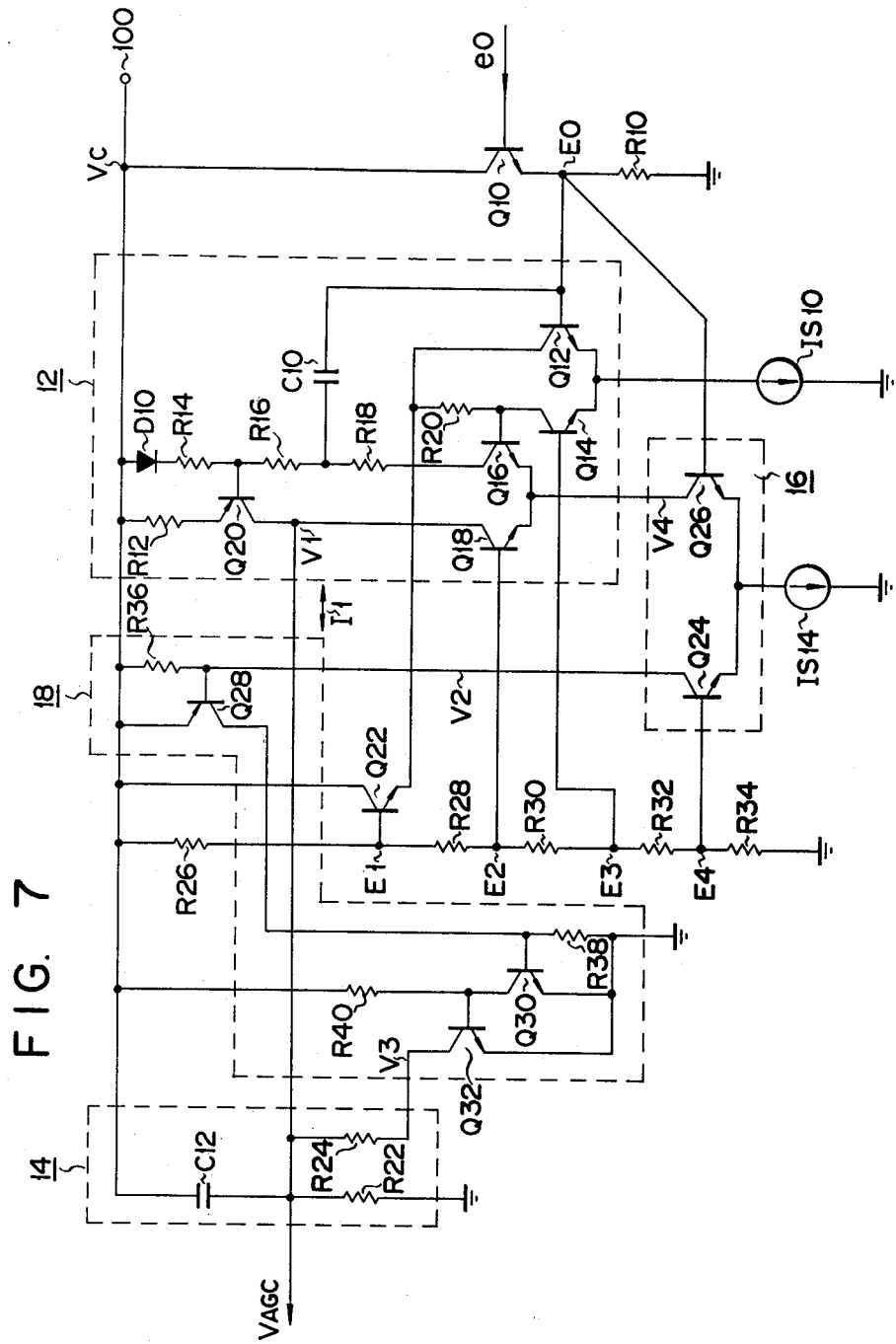
FIG. 7 shows a circuit diagram of an example of the AGC circuit shown in FIG. 4.

FIG. 7 shows the detail of the AGC circuit shown in FIG. 4. In FIG. 7, when the signal $e_o$ exceeds the given value, i.e. E0<E4, the transfer function of the detector 12 is zeroed by cutting off the transistors Q16 and Q18. The emitters of the transistors Q16 and Q18 are connected to the collector of the transistor Q26. The potential E0 is applied to the base of the transistor Q26 and the potential E4 is applied to the base of the transistor Q24. In FIG. 6, the signal $e_o$ and the second signal V2 are opposite in the phase while, in FIG. 7, those are in phase. The FIG. 7 circuit is therefore provided with an inverter circuit (Q32). The collector and the emitter of the transistor Q30 are connected to the base and the emitter of a transistor Q32 of NPN. The base of the transistor Q32 is connected through a resistor R40 to the power source 100 and the third signal V3 is derived from the collector.

When E0>E4, the AGC circuit in FIG. 7 operates in exactly the same manner as that of the AGC circuit shown in FIG. 6. When E0<E4, the transistor Q26 is turned off and the differential transistors Q16 and Q18 do not operate as an amplifier. That is, the AGC loop is shut off. Accordingly, it is conceivable that the fourth signal V4 is produced in the collector of the transistor Q26. When E0<E4, the transistors Q24, Q28 and Q30 are turned on. Then, the transistor Q32 is turned off and the time constant of the time constant circuit 14 is increased. When the level condition returns to E0>E4, that is to say, no pulse noise is superposed on the signal $e_o$, the transistor Q26 is turned on. At this time the transistor Q24 is turned off. At this time, the transistor Q32 is turned on and the time constant of the circuit 14 is decreased. In the FIG. 7 circuit, the AGC loop is shut off as mentioned above to stop the feeding of the current I1. Therefore, with the time constant increase due to the turning off of the transistor Q32, the DC level of the control signal $V_{AGC}$ is little varied by the pulse noise n. Thus, no sag as shown in FIG. 1B is produced.

Figure 8:
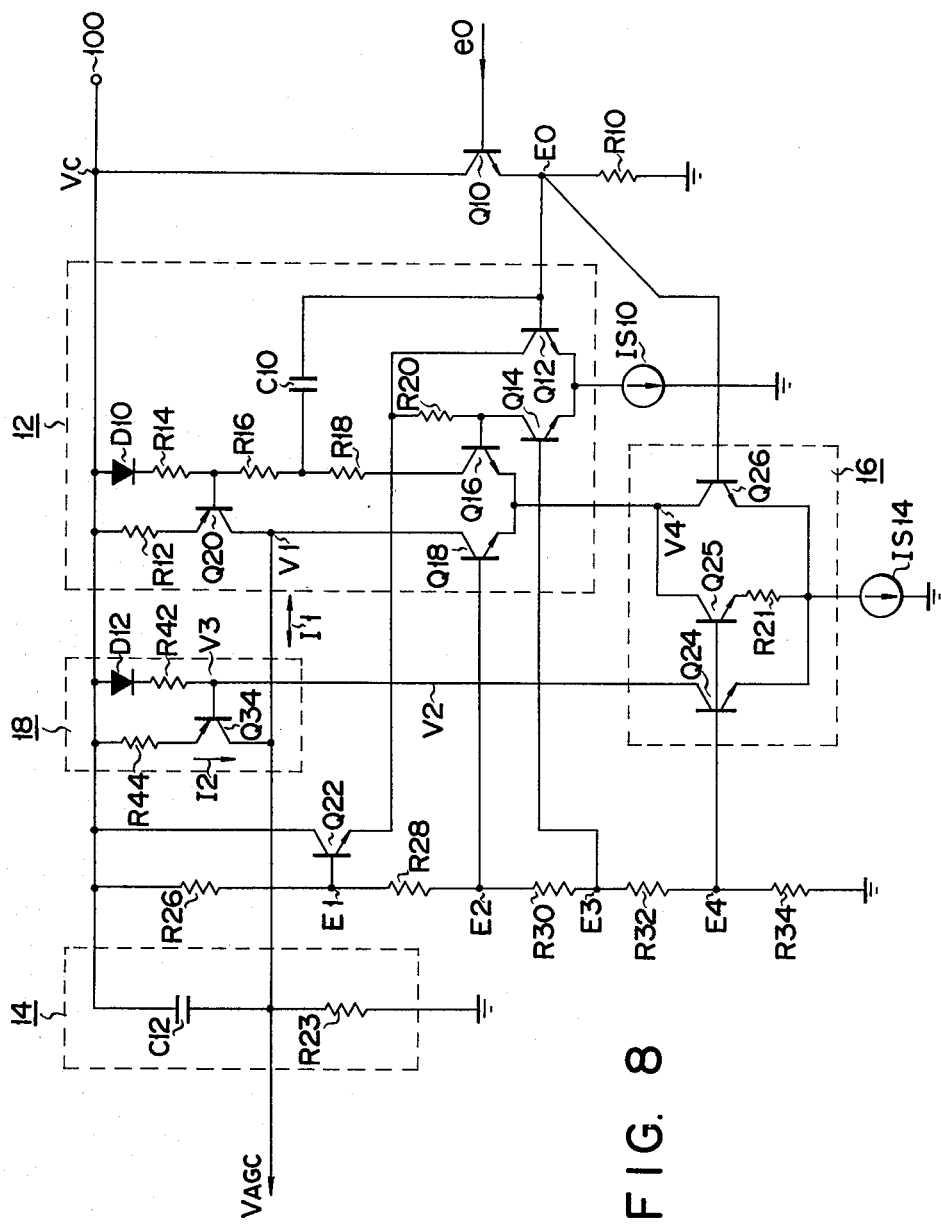
FIG. 8 shows a circuit diagram of an example of the AGC circuit shown in FIG. 3.

FIG. 8 shows a circuit corresponding to the AGC circuit shown in FIG. 3. The potential E4 is applied to the base of the transistor Q24. The connector of the transistor Q24 is coupled with the base of a PNP transistor Q34. The emitter of the transistor Q34 is connected to the power source 100 by way of a resistor R44 and the power source 100 is connected to the base of the transistor Q34 via the anode to cathode path of the diode D12 and a resistor R42. The transistor Q26 which receives at the base the potential E0, is connected at the collector to the emitters of the transistors Q16 and Q18. The collector to emitter path of the transistor Q26 is coupled in parallel with a series circuit of the collector to emitter path of a transistor Q25 of NPN and a resistor R21.

When $E0 > E4$, the transistor Q26 is turned on and the transistor Q24 is turned off. Accordingly, the transistor Q34 also is turned off. The time constant at this time is selected to be about 1.2 ms, for example. The operation in this case is exactly the same as that of the FIG. 6 or 7 circuit. The time that the transistor Q26 is turned on corresponds to the time the first transfer function G1 shown in FIG. 3 is selected. At this time, the normal or conventional AGC operation is performed. When $E0 < E4$, the transistor Q26 turned off, while the transistors Q24 and Q25 are turned on. In this case, when the transistor Q25 is turned on, the collector current of the transistor Q25 may be made small. When Q26=OFF and Q25=ON, the emitter current of the differential transistors Q16 and Q18 becomes small and therefore the gain of the detector 12 becomes small. This state corresponds to a state that the transistor function G2 is selected in FIG. 3. At this time, the magnitude of the current I1 flowing into the detector 12 becomes small and is little influenced by the current I1. In other words, the response of the AGC circuit is slow and the sag occurrence is prevented. With arrival of an excessive signal, the level condition $E0 << E4$. At this time, the turn-on current of the transistor Q25 increases and the gain of the detector 12 increases again. As a result, the current I1 increases. In this case, the response of the AGC circuit is fast. Such an operation of the transistor Q25 is further effective for preventing the lock-out phenomenon.

In FIG. 8, the time constant changing means for the time constant circuit 14 is different from that in FIG. 6 or FIG. 7. In the FIG. 8 circuit, the CR product, i.e. $C12 \times R23$, is not changed but the discharging current of the capacitor C12 is changed. That is, when the arrival of the pulse noise causes the level condition to be $E0 < E4$, the transistors Q25 and Q18 are turned on and the current I1 which is smaller than the small collector current of the transistor Q25, is absorbed by the detector 12. On the other hand, when $E0 < E4$, the transistor Q34 is turned on so that most of the current I1 is supplied from the transistor Q34. In other words, little current of I1 is fed to the capacitor C12. When the transistor Q34 is turned on, the current I2 supplied from the transistor Q34 flows into the resistor R23 to decrease the potential across the capacitor C12 so that the charging speed of the capacitor C12 becomes very slow. This indicates that the time constant apparently or substantially increases.

Figure 9:
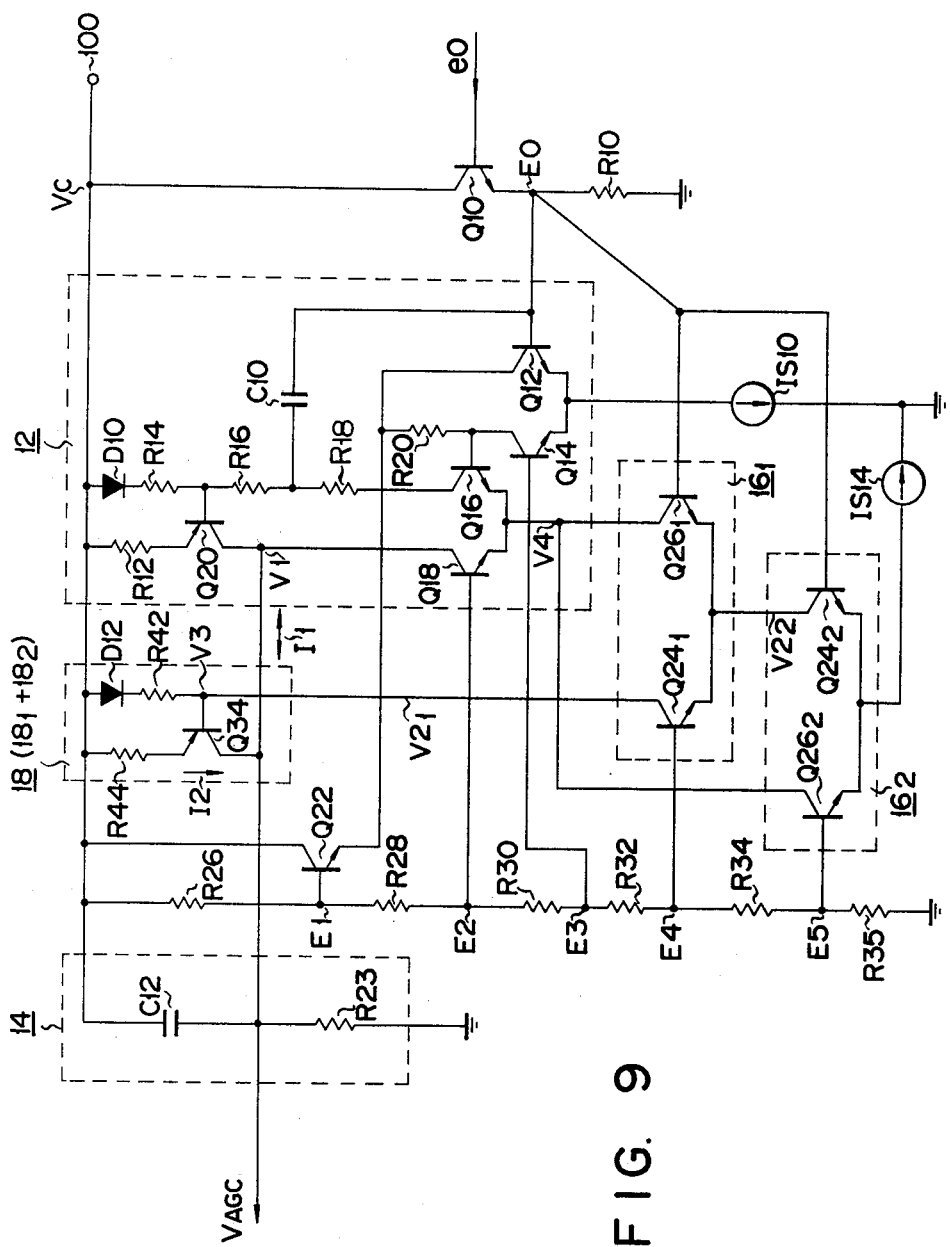
FIG. 9 shows a circuit diagram of an example of the AGC circuit shown in FIG. 5.

FIG. 9 shows a circuit corresponding to the AGC circuit shown in FIG. 5. The emitter of the transistor Q10 is connected to the base of a transistor Q24$_2$. The collector of the transistor Q24$_2$ is connected to the emitters of NPN transistors Q24$_1$ and Q16$_1$. The base of the transistor Q26$_1$ is connected to the emitter of the transistor Q10 and the base of the transistor Q24$_1$ is supplied with a first given potential E4. The emitter of the transistor Q24$_2$, together with the emitter of an NPN transistor Q26$_2$, is grounded through the current source IS14. A second given potential E5 is applied to the base of the transistor Q26$_2$. The collector of the transistor Q26$_2$, together with the collector of the transistor Q26$_1$, is connected to the emitters of the differential transistors Q16 and Q18. The collector of the transistor Q24$_1$ is connected to the base of the transistor Q34.

The transistors Q24$_1$ and Q26$_1$ cooperate to form a first level detector 16$_1$ while the transistors Q24$_2$ and Q26$_2$ a second level detector 16$_2$. The first given potential E4 is obtained by voltage-dividing the power source voltage Vc by the combination of the resistors R26 to R32 and resistors R34 and R35. The second given potential E5 is obtained by voltage-dividing the first given potential E4 by means of the combination of the resistors R34 and R35. In the circuit construction shown in FIG. 9, therefore, $E4 > E5$.

When $E0 > E4 > E5$, the transistors Q26$_1$ and Q24$_2$ are turned on while the transistors Q24$_1$, Q26$_2$ and Q34 are turned off. In this case, the normal AGC operation with the small time constant is performed, as described referring to FIG. 6.

As shown by the wave form f in FIG. 1F, when $E4 > E0 > E5$, the transistors Q24$_2$, Q24$_1$ and Q34 are turned on while the transistors Q26$_2$ and Q26$_1$ are turned off. When $E4 > E0 > E5$, the transistors Q26$_1$ and Q26$_2$ are turned off. Therefore, differential transistors Q16 and Q18 do not effect the normal amplification. Namely, the AGC loop is shut off, the current I1 becomes zero, and the AGC time constant is increased. In this case, since the transistor Q34 is turned on, the current I2 flows into the resistor R23, the charging speed of the capacitor C12 is descreased so that the DC level of the control signal $V_{AGC}$ gradually drops. That is, the time constant of the time constant circuit 14 substantially further increases. The operation has been described referring to FIG. 8.

When $E4 > E5 > E0$ as shown by the wave form g in FIG. 1F, the transistors Q24$_2$, Q26$_1$, Q24$_1$ and Q34 are turned off while the transistor Q26$_2$ is turned on. In this case, the level condition is substantially the same as that when $E0 > E4 > E5$. Accordingly, the normal AGC operation with a small AGC time constant is performed, and the AGC circuit quickly responds to an excessive signal like the signal as the wave form g in FIG. 1F, preventing the lock-out phenomenon more effectively than e.g. the FIG. 6 circuit.

Figure 10:
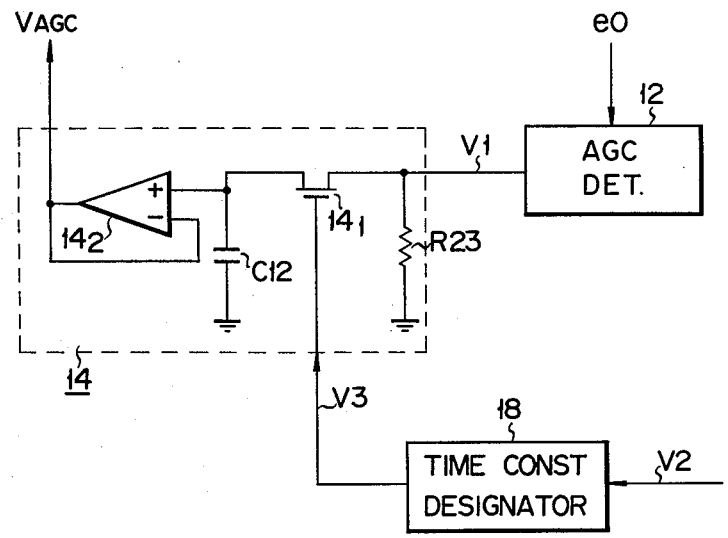
FIG. 10 shows a circuit diagram of a modification of the AGC time constant circuit used in each AGC circuit shown in FIGS. 6 to 9, which is an application of a sample/hold circuit.

Turning now to FIG. 10, there is shown a modification of the AGC time constant circuit 14 in FIGS. 6, 7, 8 or 9. The first signal V1 derived from the AGC detector 12 is applied to the drain (or source) of an FET 14$_1$ of n-channel depletion mode. The FET 14$_1$ is usually turned on. The drain of the FET 14$_1$ is grounded through a resistor R23. The source (or drain) of the FET 14$_1$ is grounded through the capacitor C12. The source of the FET 14$_1$ is connected to the input terminal of a buffer amplifier 14$_2$, which provides at the output terminal the control signal $V_{AGC}$. The third signal V3 is applied from the time constant designator 18 to the gate of the FET 14$_1$.

When the signal $e_o$ larger than the given value is inputted to the level detector 16 (not shown) and the second signal V2 is produced, the potential of the third signal V3 drops to turn off the FET 14$_1$. Following this, the source potential of the FET 14$_1$ immediately before the FET 14$_1$ is turned off is held across the capacitor C12. The held potential is used as the signal $V_{AGC}$. Then, the amplitude of the signal $e_o$ returns to the value below the given value, the potential of the third signal V3 rises so that the FET 14$_1$ is turned on. The time constant at this time almost depends on the product $C12 \times R23$ and is short (for example, 1.2 ms). The time constant circuit 14 shown in FIG. 10 is a sort of sample/hold circuit where the time constant is switched between the product C12×R23 and ∞ (infinite).

Figure 11:
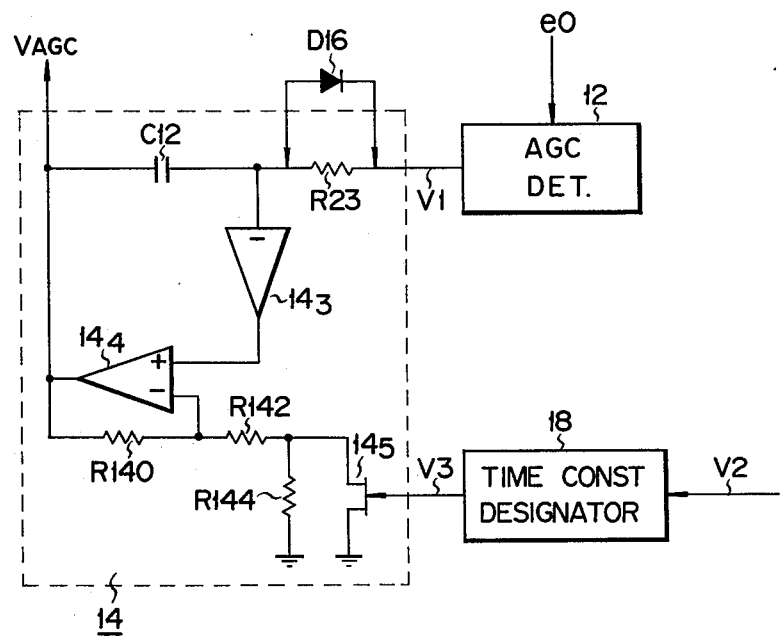
FIG. 11 shows a circuit diagram of another modification of the AGC time constant circuit in each AGC circuit shown in FIGS. 6 to 9, which is an application of a Miller integrator.

FIG. 11 shows another modification of the AGC time constant circuit 14 shown in FIGS. 6, 7, 8 or 9. The first signal V1 derived from the AGC detector 12 is applied to the non-inverted input terminal of the amplifier $14_4$ through a resistor R23 and an inverter $14_3$. The output terminal of the amplifier $14_4$ is connected through a resistor R140 to the inverted input terminal. The inverted input terminal is grounded through resistors R142 and R144. The resistor R144 is connected across the drain to source path of an n-channel depletion mode FET $14_5$. The FET $14_5$ is usually in off state. The third signal V3 is applied from the time constant designator 18 to the gate of the FET $14_5$. The output terminal of the amplifier $14_4$ is applied through the capacitor C12 to the input terminal of the inverter $14_3$. The control signal $V_{AGC}$ is derived from the output terminal of the amplifier $14_4$.

The time constant circuit 14 shown in FIG. 11 is comprised of a Miller integrator. When the third signal V3 is such a potential as to provide a gate bias below the pinch off voltage, the FET $14_5$ is cut off. The gain A1 of the amplifier at this time is approximately (R140+R142+R144)/(R142+R144). And the time constant T1 of the circuit 14 is approximately A1×C12×R23. When the mixing of a noise signal raises the potential of the third signal V3 and the internal resistance of the FET $14_5$ is sufficiently small, the gain A2 of the amplifier $14_4$ is approximately (R140×R142)/R142. The time constant T2 at this time is approximately A2×C12×R23. The internal resistance of the FET $14_5$ is continuously changed in accordance with the potential level of the third signal V3. Accordingly, the time constant of the time constant circuit 14 may be set up between T1 and T2, at will. When the third signal V3 is made to correspond to the analog signal $e_o$ exceeding the given level E4 detected by the level detector 16 (not shown), the time constant of the time constant circuit 14 may be continuously changed corresponding to the level of the signal $e_o$.

In order to change the time constant in accordance with the amplitude changing direction of the signal $e_o$, the diode D16, for example, is connected in parallel with the resistor R23.

Finally, it should be noted that the time constant referred to in the specification depends largely on the product of CR and the amplitude of the charge/discharge current flowing through the AGC circuit 14 as well. It should be further understood that the increase of the AGC time constant prevents the deformation as indicated by the solid line in FIG. 1B and thus provides the control signal $V_{AGC}$ free from the deformation, as indicated by the broken line in the same figure.

Although specific circuit constructions have been illustrated and described herein, it is not intended that the invention be limited to the elements, devices and/or circuit constructions disclosed. One skilled in the art will recognize that the particular elements, devices or sub-circuits may be used without departing from the scope and spirit of the invention.

What is claimed is:

1. An automatic gain control circuit comprising:
   (a) first means for amplifying an input signal by a gain factor controlled by a control signal;
   (b) second means for providing a first signal including a DC component corresponding to the amplitude of an output signal derived from said first means;
   (c) third means for providing said control signal with a DC level corresponding to the DC component of said first signal and having a variable time constant enough to remove the ripple component of the first signal, said first to third means forming an automatic gain control (AGC) loop;
   (d) fourth means for providing a second signal when the amplitude of said input signal or said output signal reaches a given value; and
   (e) fifth means for providing a third signal to designate the changing of the time constant of said third means when receiving said second signal, said time constant of said third means increasing to a predetermined value only in response to said third signal.

2. An automatic gain control circuit according to claim 1, wherein said AGC loop includes a plurality of transfer functions and a switch circuit for alternatively selecting these transfer functions, and a selecting condition of these transfer functions by said switch circuit is determined by a fourth signal derived from said fourth means, the fourth signal being generated upon the provision of the second signal.

3. An automatic gain control circuit according to claim 1 wherein said AGC loop includes a switch circuit for opening or closing said loop per se and the on and off state of said switch circuit is determined by a fourth signal derived from said fourth means, said fourth signal being generated upon the provision of the second signal.

4. An automatic gain control circuit according to claim 1, 2 or 3, wherein said third means is of CR type having a capacitor and resistor and the changing of the time constant is performed by changing the value of the capacitor or the resistor.

5. An automatic gain control circuit according to claim 1, 2 or 3 wherein the changing of the time constant of said third means is performed by supplying a time constant change current responding to the third signal to said third means.

6. An automatic gain control circuit according to claim 1, 2 or 3, wherein said third means includes a sample/hold circuit for holding the control signal.

7. An automatic gain control circuit according to claim 1, 2 or 3, wherein said third means includes a Miller integrator having an amplifier of which the transfer function is changed when receiving the third signal.

8. An automatic gain control circuit comprising:
   (a) first means for amplifying an input signal by a gain factor controlled by a control signal;
   (b) second means for providing a first signal including a DC component corresponding to the amplitude of an output signal derived from said first means;
   (c) third means for providing said control signal with a DC level corresponding to the DC component of said first signal and having a variable time constant enough to remove the ripple component of the first signal, said first to third means forming an automatic gain control (AGC) loop;
   (d) fourth means for providing a second signal when the amplitude of said input signal or said output signal reaches a given value; and
   (e) fifth means for providing a third signal to designate the changing of the time constant of said third means when receiving said second signal, wherein said fourth means includes a plurality of detectors each having an intrinsic value, and said fifth means includes a plurality of designators each of which are coupled with said detectors, whereby the time constant of said third means is changed depending on the respective intrinsic value of said detectors.

9. An automatic gain control circuit according to claim 8, wherein the time constant of said third means is substantially increased when receiving the third signal from one of said designators and is substantially decreased when receiving the third signal from another designator.

10. An automatic gain control circuit according to claim 9, wherein one of said detectors connecting to said former designator has a first given value and another detector connecting to said latter designator has a second given value which is larger than the first given value.

11. An automatic gain control circuit according to claim 8, wherein said third means is of CR type having a capacitor and resistor and the changing of the time constant is performed by changing the value of the capacitor or the resistor.

12. An automatic gain control circuit according to claim 8, wherein the changing of the time constant of said third means is performed by supplying a second current responding to the third signal to said third means.

13. An automatic gain control circuit according to claim 8, wherein said third means includes a sample-/hold circuit for holding the control signal immediately before the third signal is received.

14. An automatic gain control circuit according to claim 8, wherein said third means includes a Miller integrator having an amplifier of which the transfer function is changed when receiving the third signal.

15. An automatic gain control circuit comprising:
 (a) first means for amplifying an input signal by a gain factor controlled by a control signal;
 (b) second means for providing a charge/discharge current including a DC component corresponding to the amplitude of one of an input signal to said first means and an output signal derived from said first means;
 (c) third means for providing said control signal with a DC level corresponding to the DC component of said charge/discharge current and having a variable time constant enough to remove the ripple component of said charge/discharge current, said first to third means forming an automatic gain control (AGC) loop, said third means including a capacitor for determining at least in part said time constant, said charge/discharge current charging-/discharging said capacitor;
 (d) fourth means for providing a first signal when the amplitude of one of said input signal and said output signal reaches a given value; and
 (e) fifth means for providing a second signal to designate the changing of the time constant of said third means when receiving said first signal, said time constant of said third means increasing to a predetermined value only in response to said second signal.

16. An automatic gain control circuit according to claim 15, wherein said AGC loop includes a plurality of transfer functions and a switch circuit for alternatively selecting these transfer functions, and a selecting condition of these transfer functions by said switch circuit is determined by a third signal derived from said fourth means, the third signal being generated upon the provision of the first signal.

17. An automatic gain control circuit according to claim 15 wherein said AGC loop includes a switch circuit for opening or closing said loop, the on and off state of said switch circuit being determined by a third signal derived from said fourth means, said third signal being generated upon the provision of the first signal.

18. An automatic gain control circuit according to claim 15 wherein the changing of the time constant of said third means is performed by supplying a time constant change current responding to the second signal to said third means.

* * * * *